(12) United States Patent
Liu et al.

(10) Patent No.: US 9,196,380 B2
(45) Date of Patent: Nov. 24, 2015

(54) METHOD FOR MEASURING DATA RETENTION CHARACTERISTIC OF RESISTIVE RANDOM ACCESS MEMORY DEVICE

(71) Applicant: Peking University, Beijing (CN)

(72) Inventors: Lifeng Liu, Beijing (CN); Bin Gao, Beijing (CN); Jinfeng Kang, Beijing (CN); Xiaoyan Liu, Beijing (CN); Yi Wang, Beijing (CN)

(73) Assignee: Peking University, Beijing (CN)

( * ) Notice: Subject to any disclaimer, the term of this patent is extended or adjusted under 35 U.S.C. 154(b) by 457 days.

(21) Appl. No.: 13/705,457

(22) Filed: Dec. 5, 2012

(65) Prior Publication Data

US 2013/0094281 A1    Apr. 18, 2013

Related U.S. Application Data

(63) Continuation of application No. PCT/CN2011/074320, filed on May 19, 2011.

(30) Foreign Application Priority Data

Sep. 8, 2010    (CN) .......................... 2010 1 0275600

(51) Int. Cl.
  *G11C 11/00*    (2006.01)
  *G11C 29/00*    (2006.01)
  (Continued)

(52) U.S. Cl.
  CPC    *G11C 29/00* (2013.01); *G11C 7/04* (2013.01); *G11C 13/0007* (2013.01);
  (Continued)

(58) Field of Classification Search
  CPC ...................................................... G11C 29/00
  USPC ........................................................ 365/148
  See application file for complete search history.

(56) References Cited

U.S. PATENT DOCUMENTS 6,851,076 B1    2/2005    Cook, III et al.
8,067,815 B2 *  11/2011   Chien et al. ................... 257/530
(Continued)

FOREIGN PATENT DOCUMENTS

CN    101171645 A    4/2008
CN    101183564 A    5/2008
CN    101770816 A    7/2010

OTHER PUBLICATIONS

Wan, H. J., et al., "Retention-failure mechanism of TaN/CuxP/Cu resistive memory with good data retention capability," Journal of Vacuum Science & Technology B: Microelectronics and Nanometer Structures. Nov. 2009, vol. 27, No. 6, pp. 2468-2471, ISSN 1071-1023.

(Continued)

*Primary Examiner* — Hoai V Ho
*Assistant Examiner* — Minh Dinh
(74) *Attorney, Agent, or Firm* — BainwoodHuang

(57) ABSTRACT

A method for measuring data retention characteristic of an RRAM device includes: a) controlling a temperature of a sample stage to maintain the RRAM device at a predetermined temperature; b) setting the RRAM device to a high-resistance state or a low-resistance state; c) measuring data retention time by applying a predetermined voltage to the RRAM device so that a resistive state failure of the RRAM device occurs; d) repeating the steps a)-c) to perform a plurality of measurements; e) calculating a resistive state failure probability F(t) of the RRAM device from the data retention time in the plurality of measurements; and f) fitting the resistive state failure probability F(t), and calculating predicted data retention time $t_E$ by using parameters obtained from the fitting. The data retention time of the RRAM device may be predicted by combining voltage acceleration and temperature acceleration.

17 Claims, 8 Drawing Sheets

(51) Int. Cl.
- *G11C 13/00* (2006.01)
- *G11C 29/50* (2006.01)
- *G11C 7/04* (2006.01)
- *G11C 29/06* (2006.01)

(52) U.S. Cl.
CPC ....... *G11C 13/0035* (2013.01); *G11C 13/0069* (2013.01); *G11C 29/06* (2013.01); *G11C 29/50016* (2013.01); *G11C 13/00* (2013.01); *G11C 2013/0073* (2013.01)

(56) References Cited

U.S. PATENT DOCUMENTS

2007/0034850 A1 2/2007 Kostylev et al.
2012/0081946 A1* 4/2012 Kawabata et al. ............ 365/148
2012/0294063 A1* 11/2012 Mizuguchi et al. ........... 365/148
2013/0326284 A1* 12/2013 Losh et al. ................... 714/47.2

OTHER PUBLICATIONS

Wan, H. J., et al., "Research on reliability of Resistive memory RRAM," Chinese Selected Master's Thesis Full-text Databases. Oct. 13, 2010, pp. 21-32.

First Office Action issued Oct. 21, 2013 from SIPO of China in counterpart Chinese application No. 201010275600.0.

English translation of First Office Action issued Oct. 21, 2013 from SIPO of China in counterpart Chinese application No. 201010275600.0.

* cited by examiner

METHOD FOR MEASURING DATA RETENTION CHARACTERISTIC OF RESISTIVE RANDOM ACCESS MEMORY DEVICE

TECHNICAL FIELD

The present disclosure relates to a method for testing a resistive random access memory (RRAM) device, and particularly to a method for measuring data retention characteristic of an oxide RRAM device.

BACKGROUND

Currently, development of microelectronic industry prompts an increasingly progress of memory technology. An object of a memory industry is to improve an integration density and to reduce a production cost. A non-volatile memory has an advantage of maintaining data information without a power supply, and plays an important role in information storage.

RRAM is advantageous due to its high speed (<5 ns), low power consumption (<1V), high memory density, and easy integration etc. RRAM is a strong competitor of next generation of semiconductor memory. Such a memory device typically has a structure of Metal-Insulator-Metal (M-I-M), including a layer of a variable-resistance material between two metal electrodes.

FIG. 1 illustrates a top view of a basic structure of an RRAM array. FIG. 2 illustrates a cross-sectional view of a memory cell of the RRAM array alone line A-A' in FIG. 1. The RRAM array may include RRAM devices 10 arranged in a plurality of rows and columns. Each of the RRAM devices 10 may include a stack of an isolation dielectric layer 101, a bottom electrode layer 102, a layer 103 of a variable-resistance material and a top electrode layer 104.

Typically, the variable-resistance material may be a transition metal oxide, such as $HfO_2$, $TiO_2$, $ZrO_2$, NiO, ZnO, $W_2O_5$ etc. The variable-resistance material may exhibit two stable states, i.e. a high-resistance state and a low-resistance state, corresponding to digital "0" and "1" respectively.

The variable-resistance material changes between the states of different resistance values possibly due to a filament conductive channel formed inside an oxide film. Open/close of the filament conductive channel determines whether a memory cell is in the high-resistance state or in the low-resistance state.

A desired RRAM device 10 may be selectively accessed using word lines and bit lines (not shown) for reading, writing and erasing operations. Typically, change from the high-resistance state to the low-resistance state is referred to as a programming or SET operation, and change from the low-resistance state to the high-resistance state is referred to as an erasing or RESET operation.

If a previously-opened filament channel is spontaneously closed without being controlled or a previously-closed filament channel is spontaneously opened without being controlled when an external voltage is applied thereto, the resistive state of the memory cell will change spontaneously but not in a controlled manner. It causes failure of data stored in the RRAM device. The failure of the transition metal oxide RRAM device may be the failure in a high-resistance state (digital "0"), or the failure in a low-resistance state (digital "1"). The failure in the high-resistance state and in the low-resistance state may be collectively referred to as a "resistive state failure".

Therefore, a method for testing data retention time of the RRAM device is desired for estimating performance of the RRAM device. However, there is still no clear research result in failure mechanism and model of the RRAM device. No a test method for the RRAM device has been proposed.

SUMMARY OF THE DISCLOSURE

An object of the present disclosure is to provide a method for measuring data retention characteristic of an RRAM device. A further object of the present disclosure is to reduce the time for measurement.

According to a first aspect of the present disclosure, a method for measuring data retention characteristic of an RRAM device is provided. The method comprises steps of:

a) controlling a temperature of a sample stage to maintain the RRAM device at a predetermined temperature;

b) setting the RRAM device to be a high-resistance state or a low-resistance state;

c) measuring data retention time by applying a predetermined voltage to the RRAM device so that a resistive state failure of the RRAM device occurs;

d) repeating the steps a)-c) to perform a plurality of measurements;

e) calculating a resistive state failure probability F(t) of the RRAM device from the data retention time in the plurality of measurements; and f) fitting the resistive state failure probability F(t), and calculating predicted data retention time $t_E$ by using parameters obtained from the fitting.

According to a preferred aspect of the present disclosure, predicted data retention time at different bias voltages are measured. Predicted data retention time at a zero bias voltage is extrapolated from the predicted data retention time at the different bias voltages.

According to another preferred aspect of the present disclosure, predicted data retention time at different temperatures are measured. Predicted data retention time at a room temperature is extrapolated from the predicted data retention time at the different temperatures.

The method according to the present disclosure provides a statistical method for estimating the data retention time of the RRAM device. The performance parameters of the RRAM device can be thus obtained accurately. According to the preferred aspects of the present disclosure, the data retention time of the RRAM device may be measured at a high temperature and/or at a stress test condition (i.e. a specific bias voltage). The failure of the RRAM device occurs earlier than the case at a room temperature and at a zero bias voltage. Therefore, the time for the measurement may be significantly decreased.

DETAILED DESCRIPTION

The inventors propose a physical model of a failure mechanism of an RRAM device, and an estimation model of data retention time of the RRAM device based thereon, and further propose a novel measurement method, which may be important for estimating data retention characteristic of the RRAM device.

In the RRAM, a conductive channel in an oxide film may be mainly formed by oxygen vacancies. Generation or recombination of the oxygen vacancies may cause open/close of the conductive channel.

The Inventors propose a resistive state (data) failure model as follows.

In the oxide film, a generation probability of the oxygen vacancies in the high-resistance state or a recombination probability of the oxygen vacancies in the low-resistance state may be represented as $$p = \exp\left(-\frac{E_a}{kT}\right), \quad (1)$$

wherein $E_a$ is activation energy of generation or recombination of the oxygen vacancies, k is a Boltzmann constant, and T is an absolute temperature.

A failure probability F(t) of the RRAM device within time t may be represented as $$F(t) = 1 - (1-p)^{\frac{nt}{t_0}}, \quad (2)$$

wherein n is a number of lattice points where spontaneous generation of oxygen vacancies occurs for the resistive failure in a high-resistance state, or a number of lattice points where spontaneous recombination of oxygen vacancies occurs for the resistive failure in a low-resistance state; $t_0$ is a vibration period of oxygen atoms; and t is data retention time.

Therefore, ln[1−F(t)] and the data retention time t of the RRAM device may have a linear relationship.

A predicted data retention time $t_E^T$ of the RRAM device may be $$t_E^T = \frac{t_0}{n|\ln(1-p)|} \approx \frac{t_0}{np} = \frac{t_0}{n}\exp\left(\frac{E_a}{kT}\right)(p \ll 1), \quad (3)$$

$$\frac{1}{T}$$

Therefore, the predicted data retention time $t_E^T$ and have an exponential relationship.

With an external electric field (by applying a bias voltage), the data retention time will be decreased. The relationship between the predicted data retention time $t_E^V$ and the applied voltage V may be shown in Formula (4):

$$t_E^V = t_E \exp\left(-\frac{qaV}{2dkT}\right), \quad (4)$$

wherein a is a crystal lattice constant, d is an effective thickness, and q is an oxygen ion charge.

Therefore, the predicted data retention time $t_E^V$ and V have an exponential relationship.

Figure 1:
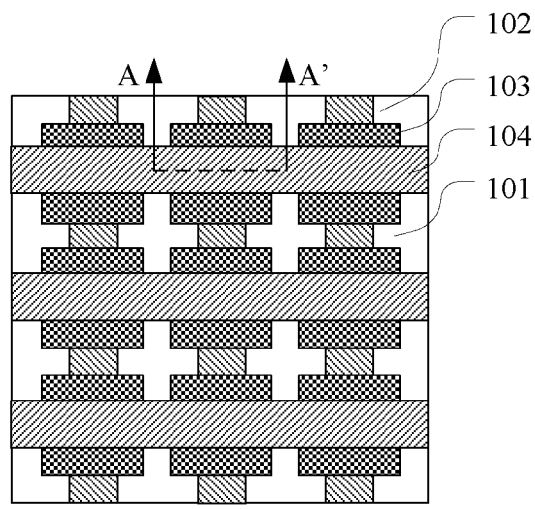
FIG. 1 illustrates a top view of a basic structure of an RRAM array.
Figure 2:
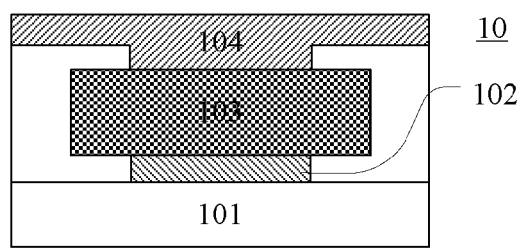
FIG. 2 illustrates a cross-sectional view of a memory cell of an RRAM array alone line A-A' in FIG. 1.
Figure 3:
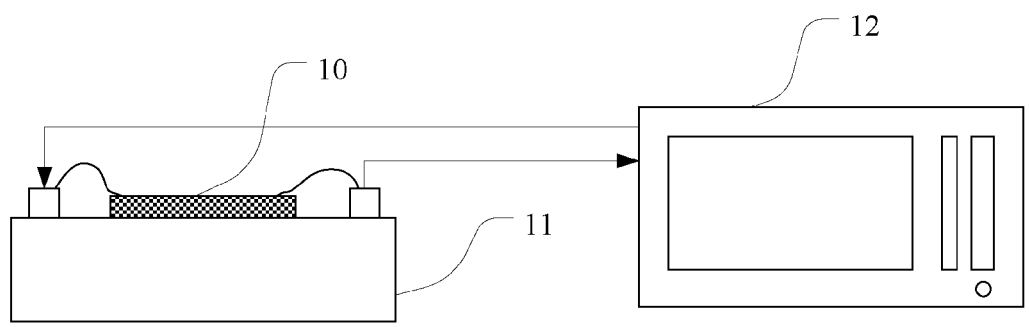
FIG. 3 illustrates a block diagram of a test system for measuring data retention characteristic of an RRAM device.

In order to verify this model, resistance measurements of the RRAM element at different temperatures and under different stress test conditions may be performed by a test system as shown in FIG. 3. The test system may comprise a sample stage 11 a temperature of which may be varied in a controlled manner, and a semiconductor parameter tester 12 (e.g. a precise semiconductor parameter analyzer 4156C available from Agilent Technologies, or a semiconductor characterization analysis system 4200 available from Keithley Instruments) connected to probes of the sample stage. A sample of the RRAM device 10 may be placed on the sample stage 11, and a bottom electrode layer 102 and a top electrode layer 104 of the RRAM device 10 may be electrically connected to the probes of the sample stage 11.

The temperature of the sample stage 11 may be varied according to test requirements. The semiconductor parameter tester 12 may apply a predetermined bias voltage or voltage and current pulses to the sample on the sample stage 11. Thereby, an I-V electric characteristic of the RRAM device at different temperatures and different bias voltages may be measured. The test system as shown in FIG. 3 is well-known to one skilled in the art.

Figure 4:
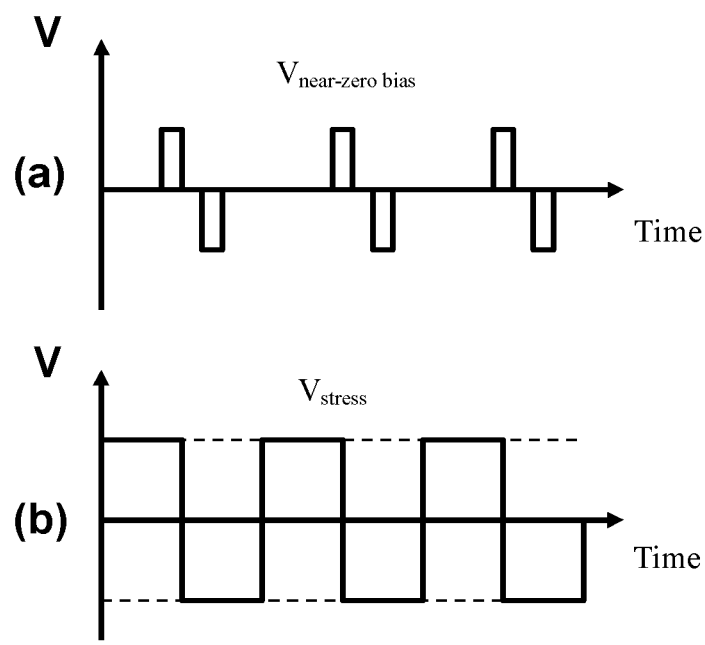
FIG. 4 shows a test voltage applied when data retention time of an RRAM device is measured: (a). the test voltage is a short voltage pulse with small positive/negative peak values, for measuring the data retention time of the RRAM device under a near-zero bias voltage condition; and (b) the test voltage is alternative positive and negative bias voltages, for measuring the data retention time of the RRAM device under a stress test condition.

FIG. 4(a) shows a voltage pulse applied to the RRAM device under a near-zero bias voltage condition, for measuring the data retention time of the RRAM device at the near-zero bias voltage. Given a small pulse voltage (e.g. 0.1V) and a small pulse width, a current through the RRAM device may be read to represent a resistance value of the RRAM device. As such, the device may be affected by the applied electric signal only during a short time period, but not affected by the applied voltage during other time periods. Thus, an effect of the applied measurement signal to the data retention time of the RRAM device may be avoided. Moreover, a negative voltage with the same duration and the same amplitude as those of a positive voltage may immediately follow the positive voltage, so as to avoid a charge accumulation effect when reading the voltage, and thus avoid a possible breakdown due to the charge accumulation effect.

FIG. 4(b) shows a bias voltage applied under the stress test condition, for measuring the data retention time when the bias voltage is applied. An effect of a normal bias voltage to the resistive state data retention time of the RRAM device may be estimated by applying a voltage with a fixed amplitude to the RRAM during a period of time. Moreover, a negative voltage with the same duration and the same amplitude as those of a positive voltage may be applied immediately after the positive voltage, so as to avoid a charge accumulation effect when reading the voltage, and thus avoid a possible breakdown due to the charge accumulation effect.

Figure 5:
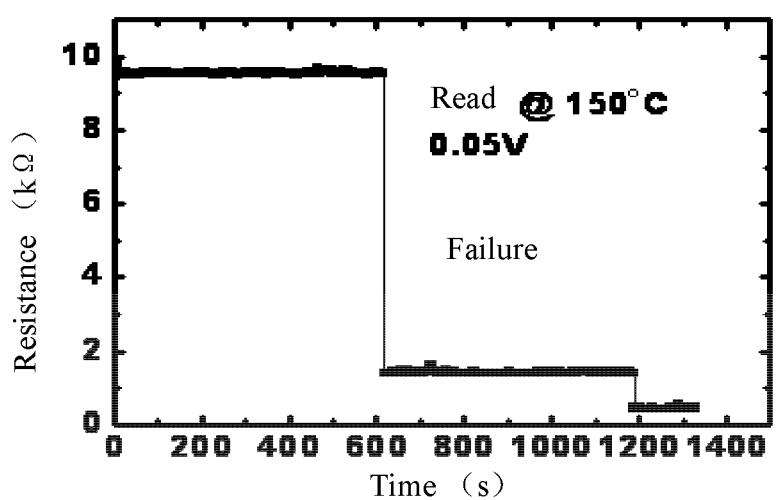
FIG. 5 shows a relationship between a resistance and a time when an RRAM exhibits a resistive failure in a high-resistance state.

FIG. 5 shows a relationship between a resistance and a time when the RRAM device exhibits a resistive failure in a high-resistance state. Under a condition of a specific temperature (150° C.) and a specific bias voltage (0.05V), a voltage pulse as shown in FIG. 4(a) may be applied, for measuring the data retention time at a near-zero bias voltage. The RRAM device is initially in the high-resistance state, and is changed to the low-resistance state at about 600 s, i.e. exhibiting the high-resistance state failure. Therefore, it may be determined that the data retention time of the RRAM device is 600 s.

Figure 6:
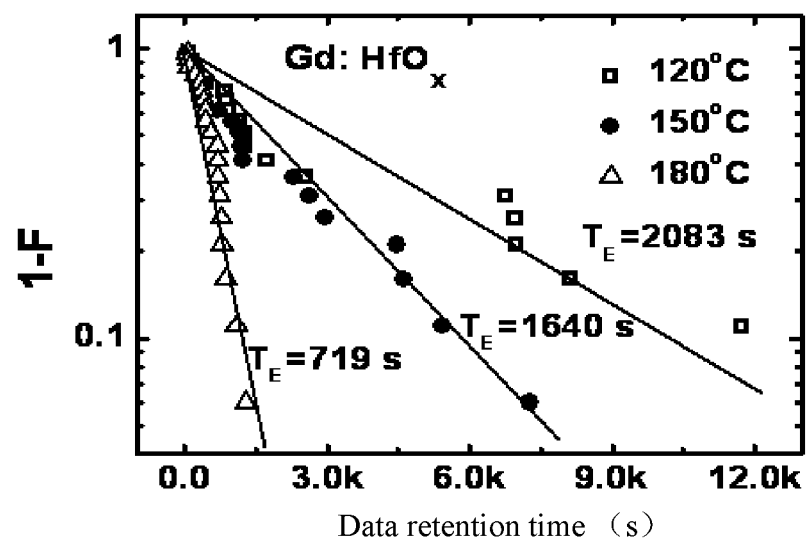
FIG. 6 shows a statistic distribution of data retention time when an RRAM device exhibits a resistive failure in a high-resistance state under a near-zero bias voltage condition.

FIG. 6 shows a statistic distribution of the data retention time when the RRAM device exhibits a resistive failure in a high-resistance state at the near-zero bias voltage.

Firstly, under the condition of the near-zero bias voltage and different temperatures, the relationship between the resistance and the time (i.e. a curve similar with the one as shown in FIG. 5) may be measured a plurality of times for the same RRAM device or different RRAM devices, to obtain data retention time at various temperatures. Then, the resistive failure probability F(t) in a high-resistance state of the RRAM device at various temperatures may be calculated according to F(t)=number of samples which have data retention time <t/total number of failed samples. Finally, a relationship between 1−F(t), which is a function of the high-resistance state failure probability F(t), and the measured data retention time t of the RRAM device at various temperatures (e.g. 120° C., 150° C., 180° C.) is shown in FIG. 6 to represent the statistic distribution of the data retention time under various bias voltages and temperatures. In FIG. 6, 1-F(t) is shown in a logarithmic vertical axis, and the measured data retention time t is shown in a horizontal axis with a unit s.

It should note that ln[1−F(t)], which is a function of the high-resistance state failure probability F(t), and the data retention time t of the RRAM device have a linear relationship, which in turn proves that Formula (2) is correct.

Further, the relationship at various temperatures in FIG. 6, i.e. the relationship between the high-resistance state failure probability F(t) and the data retention time, may be fitted according to Formula (2) to obtain parameters p and t0/n.

Then, the parameters may be substituted into Formula (3) to calculate the predicted data retention time $t_E$ at various temperatures.

Figure 7:
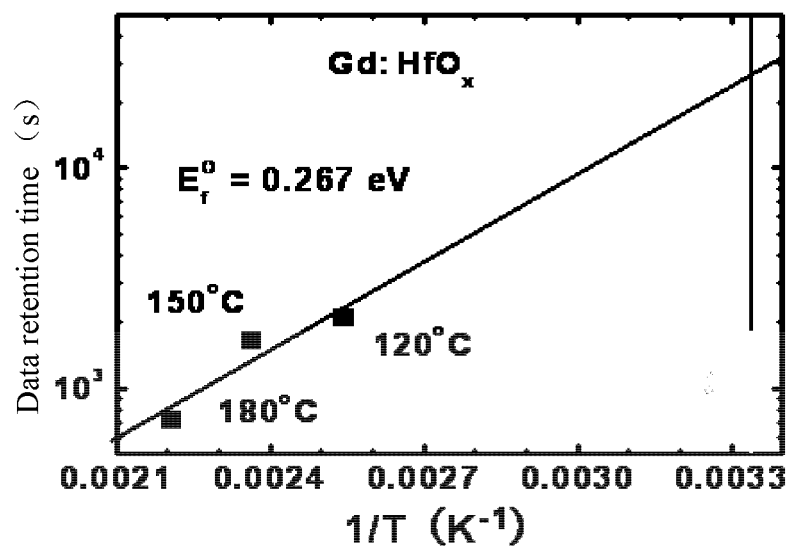
FIG. 7 shows a relationship between predicted data retention time and a temperature when an RRAM device exhibits a resistive failure in a high-resistance state under a near-zero bias voltage condition, wherein illustrates an approach for extrapolating to data retention time at a room temperature from a high temperature.

FIG. 7 shows a relationship between the predicted data retention time t (in a logarithmic vertical axis with a unit s) in the high-resistance state failure and a reciprocal of the temperature 1/T (in a horizontal axis with a unit $K^{-1}$).

It should note that lnt, which is a function of the predicted data retention time in the high-resistance state failure, and the reciprocal of the temperature 1/T have a linear relationship, which in turn proves that Formula (3) is correct.

Further, the predicted data retention time of the RRAM device in the high-resistance state at the room temperature may be determined by extrapolation.

Figure 8:
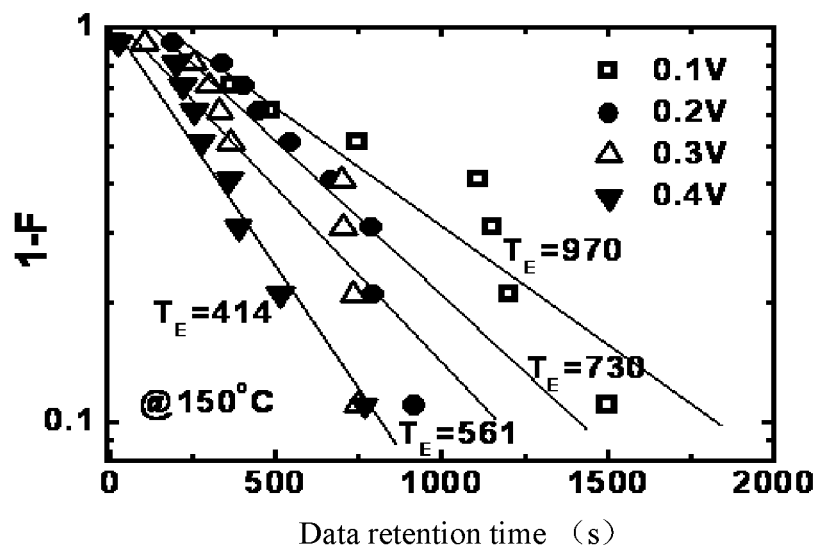
FIG. 8 shows a statistic distribution of data retention time when an RRAM device exhibits a resistive failure in a high-resistance state under different stress test conditions.

FIG. 8 shows a statistic distribution of the data retention time when the RRAM device exhibits a resistive failure in a high-resistance state under different stress test conditions.

Firstly, under the condition of 150° C. and different temperatures, the relationship between the resistance and the time (i.e. a curve similar with the one as shown in FIG. 5) may be measured a plurality of times for the same RRAM device or different RRAM devices, to obtain data retention time at various bias voltages. Then, the resistive failure probability F(t) in a high-resistance state of the RRAM device at various temperatures may be calculated according to F(t)=number of samples which have data retention time <t/total number of failed samples. Finally, a relationship between 1−F(t), which is a function of the high-resistance state failure probability F(t), and the data retention time of the RRAM device at various bias voltages (e.g. 0.1V, 0.2V, 0.3V, 0.4V) is shown in FIG. 8 to represent the statistic distribution of the data retention time at various bias voltages and temperatures. In FIG. 8, 1−F(t) is shown in a logarithmic vertical axis, and the measured data retention time t is shown in a horizontal axis with a unit s.

It should note that ln[1−F(t)], which is a function of the high-resistance state failure probability F(t) and the data retention time t of the RRAM device, have a linear relationship, which in turn proves again that Formula (2) is correct.

Further, the relationship at various bias voltages in FIG. 8, i.e. the relationship between the high-resistance state failure probability F(t) and the data retention time, may be fitted according to Formula (2) to obtain parameters p and t0/n. Then, the parameters may be substituted into Formula (4) to calculate the predicted data retention time $t_E$ at various bias voltages.

Figure 9:
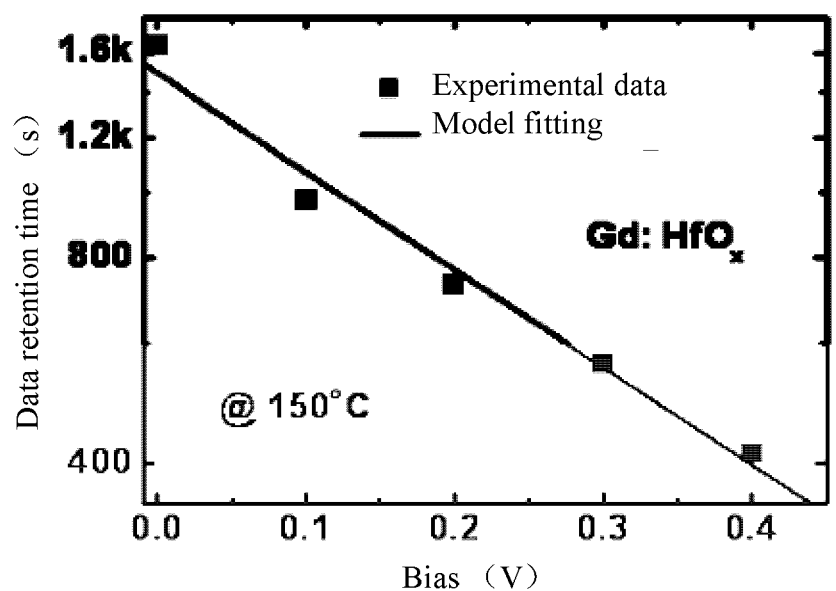
FIG. 9 shows a relationship between predicted data retention time and a bias voltage when an RRAM device exhibits a resistive failure in a high-resistance state under a stress test condition.

FIG. 9 shows a relationship between the predicted data retention time t (in a logarithmic vertical axis with a unit s) and the bias voltage V (in the horizontal axis with a unit V) when an RRAM device exhibits a resistive failure in a high-resistance state under the stress test condition. The temperature (150° C.) of the sample stage may be kept unchanged.

It should note that lnt, which is a function of the predicted data retention time in the high-resistance state failure and the bias voltage V have a linear relationship, which in turn proves that Formula (4) is correct.

Further, the predicted data retention time of the RRAM device in the high-resistance state at the zero bias voltage may be determined by extrapolation.

Moreover, experiment results in FIGS. 7 and 9 further prove that the data retention time of the RRAM device in the high-resistance state failure comply with a specific statistic distribution rule shown in FIG. 6.

Because Formulas (1) to (4) also hold for the resistive failure in a low-resistance state, the above experimental results can also be obtained for the resistive failure in the low-resistance state. The differences lie in that Ea in Formula (1) represents the activation energy that the oxygen vacancies recombines with the oxygen ion, and n in Formula (2) represents a number of oxygen vacancies to be recombined. Other parameters in the above Formulas are identical for the resistive failure both in the high-resistance state and in the low-resistance state.

Based on the resistive state retention characteristic model as discussed above, the inventors propose a method for estimating the data retention time of the RRAM device at the room temperature.

In the following embodiments, the predicted data retention time of the RRAM device with a structure for example of TiN/Gd:HfO$_2$/Pt may be measured by using the test system as shown in FIG. 3, wherein the RRAM device may be placed on the sample stage 11.

First Embodiment

Figure 10:
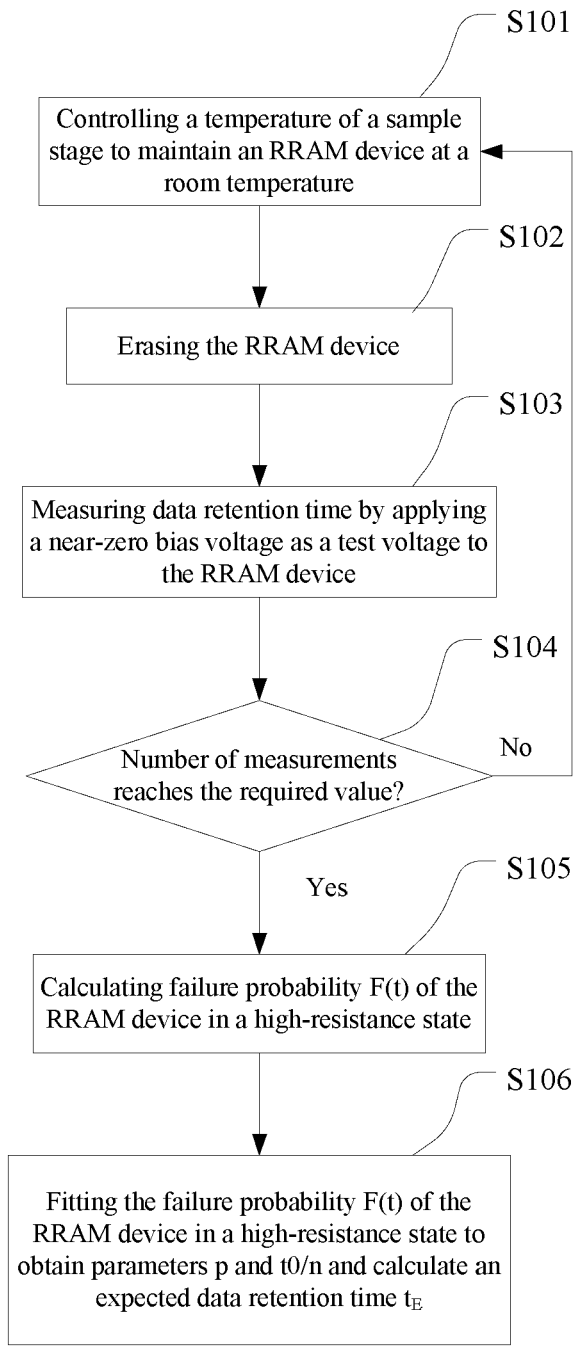
FIG. 10 shows a flowchart of a method for measuring data retention characteristic of an RRAM device according to a first embodiment of the present disclosure.

The method according to the first embodiment may perform measurements directly at the room temperature and at near-zero bias voltage, in order to obtain the predicted data retention time of the RRAM device at the room temperature. The method may comprise the following steps (see FIG. 10).

In step S101, the RRAM device may be maintained at the room temperature (25° C.) by controlling the temperature of the sample stage 11.

In step S102, an erasing operation may be performed on the RRAM device, so that the RRAM device is in the high-resistance state.

In step S103, the test voltage as shown in FIG. 4(a) may be applied to the RRAM device, in order to measure variation of the resistance of the RRAM device at the near-zero bias voltage with the time (as shown in FIG. 5), and to obtain the measured data retention time.

In step S104, the steps S101-S103 may be repeated a plurality of times (e.g. at least 10 times) for a plurality of different RRAM devices on the same chip or the same RRAM device, so as to obtain a plurality of measured data retention time.

For the same RRAM device which has been tested, it may be measured again after the erasing operation of the step S102.

In step S105, the high-resistance state failure probability F(t) of the RRAM device may be calculated according to F(t)=number of samples which have data retention time <t/total number of failed samples (as shown in FIGS. 6 and 8).

In step S106, the high-resistance state failure probability F(t) of the RRAM device may be fitted according to Formula (2) to obtain the parameters p and t0/n. Then, the parameters may be substituted into Formula (3) to calculate the predicted data retention time $t_E$ at the room temperature and at the near-zero bias voltage.

As a result, the predicted data retention time $t_E^{0,RT}$ in the high-resistance state failure at the room temperature and at the near-zero bias voltage may be obtained in the first embodiment.

If a programming operation is performed on the device in the step S102 to have a low-resistance state, followed by the same steps as mentioned above for the high-resistance state, the predicted data retention time in the low-resistance state failure may be obtained.

Second Embodiment

The method according to the second embodiment may perform measurements at a high temperature and at the near-zero bias voltage, in order to obtain the predicted data retention time of the RRAM device at the room temperature by extrapolation.

Due to the exponential relationship between the predicted data retention time and the temperature (referring to Formula (3)), a temperature acceleration measurement may be performed on the RRAM device. The temperature acceleration measurement means increasing the temperature of the RRAM device to accelerate failure of the device, so as to obtain the data retention time of the device at the high temperature. The temperature acceleration measurement may result in that the failure of the RRAM device occurs earlier than the case at the room temperature. Thus, the time for the measurement may be significantly reduced.

According to the statistic distribution of the predicted data retention time measured at several higher different temperatures (as shown in FIG. 6), the predicted data retention time of the RRAM at the room temperature may be obtained by extrapolation, according to the exponential rule between the predicted data retention time and the reciprocal of the temperature (as shown in FIG. 7).

Figure 11:
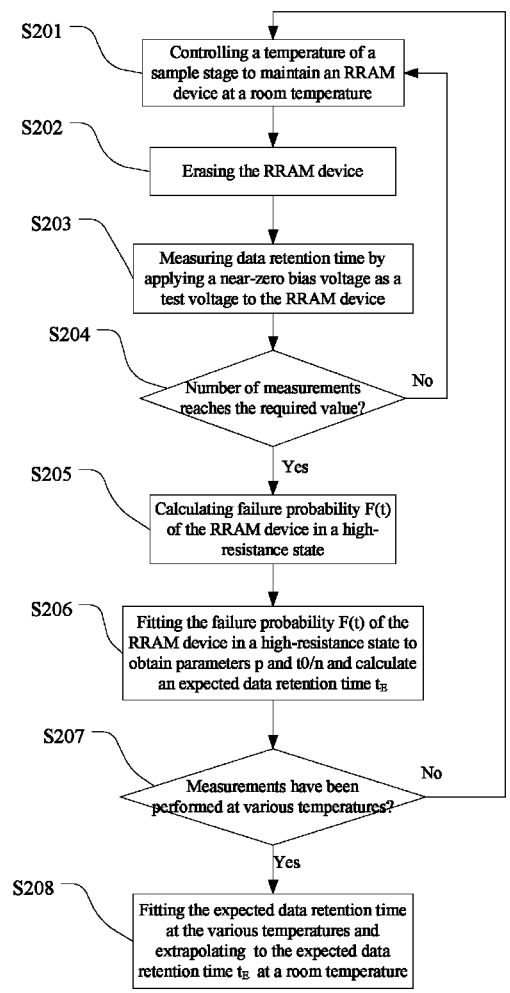
FIG. 11 shows a flowchart of a method for measuring data retention characteristic of an RRAM device according to a second embodiment of the present disclosure.

The method according to the second embodiment may comprise the following steps (see FIG. 11).

In step S201, the RRAM device may be maintained at a constant temperature (e.g. 120° C.) by controlling the temperature of the sample stage 11.

In step S202, an erasing operation may be performed on the RRAM device, so that the RRAM device is in the high-resistance state.

In step S203, the test voltage as shown in FIG. 4(a) may be applied to the RRAM device, in order to measure a variation of the resistance of the RRAM device at the near-zero bias voltage with the time (as shown in FIG. 5), and to obtain the measured data retention time.

In step S204, the steps S201-S203 may be repeated a plurality of times (e.g. at least 10 times) for a plurality of different RRAM devices on the same chip or the same RRAM device, so as to obtain a plurality of measured data retention time.

For the same RRAM device which has been tested, it may be measured again after the erasing operation of the step S202. In step S205, the high-resistance state failure probability F(t) of the RRAM device may be calculated according to F(t)=number of samples which have data retention time <t/total number of failed samples (as shown in FIG. 6).

In step S206, the high-resistance state failure probability F(t) of the RRAM device may be fitted according to Formula (2) to obtain the parameters p and t0/n. Then, the parameters may be substituted into Formula (3) to calculate the predicted data retention time $t_E$ at 120° C. and at the near-zero bias voltage.

In step S207, the steps S201-206 may be repeated several times, wherein the temperature of the sample stage 11 may be changed in the step S201 to obtain the predicted data retention time $t_E$ at different temperatures (e.g. 150° C., 180° C.) respectively.

In step S208, the predicted data retention time obtained at various temperatures (e.g. 120° C., 150° C., 180° C.) may be fitted according to Formula (3) to extrapolate to the predicted data retention time $t_E$ at the room temperature (as shown in FIG. 7).

As a result, the predicted data retention time $t_E^{\sim 0,RT}$ in the high-resistance state failure at the room temperature and at the near-zero bias voltage may be obtained in the second embodiment.

If a programming operation is performed on the device in the step S202 to have a low-resistance state, followed by the same steps as mentioned above for the high-resistance state, the predicted data retention time in the low-resistance state failure may be obtained.

Third Embodiment

The method according to the third embodiment may perform measurements at the room temperature and under the stress test condition, in order to obtain the predicted data retention time of the RRAM device at the zero bias voltage by extrapolation.

Due to the exponential relationship between the predicted data retention time and the bias voltage applied under the stress test condition (referring to Formula (4)), a voltage acceleration measurement may be performed on the RRAM device. The voltage acceleration measurement means applying a specific bias voltage to the RRAM device to accelerate failure of the device, so as to obtain the data retention time of the device at the applied bias voltage. The voltage acceleration measurement may result in that the failure of the RRAM device occurs earlier than the case at the zero bias voltage condition. Thus, the time for the measurement may be significantly reduced.

According to the statistic distribution of the predicted data retention time measured at several higher different bias voltages (as shown in FIG. 8), the predicted data retention time of the RRAM at the zero bias voltage may be obtained by extrapolation, according to the exponential rule between the predicted data retention time and the bias voltage (as shown in FIG. 9).

Figure 12:
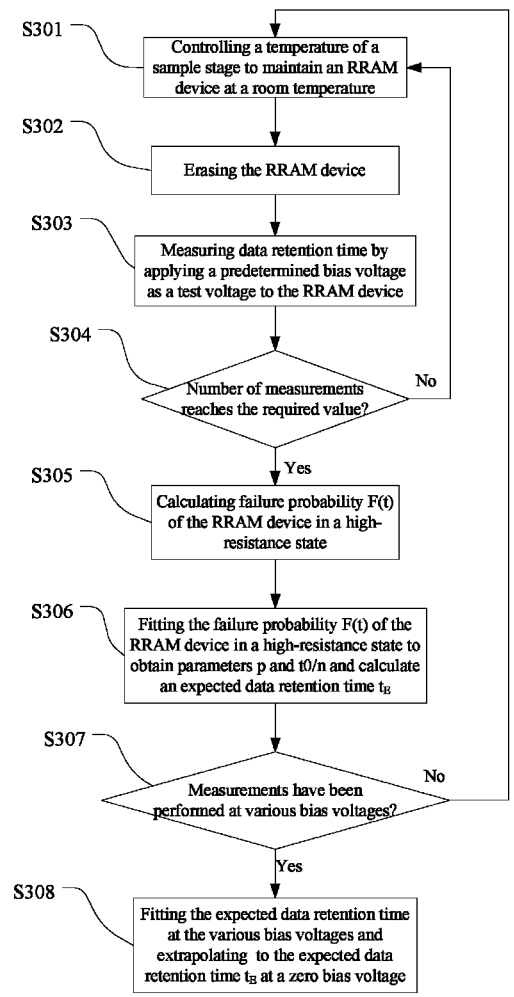
FIG. 12 shows a flowchart of a method for measuring data retention characteristic of an RRAM device according to a third embodiment of the present disclosure.

The method according to the third embodiment may comprise the following steps (see FIG. 12).

In step S301, the RRAM device may be maintained at the room temperature (e.g. 25° C.) by controlling the temperature of the sample stage 11.

In step S302, an erasing operation may be performed on the RRAM device, so that the RRAM device is in the high-resistance state.

In step S303, the bias voltage (e.g. 0.1V) as shown in FIG. 4(b) may be applied to the RRAM device, in order to measure a variation of the resistance of the RRAM device under the stress test condition with the time (as shown in FIG. 5), and to obtain the measured data retention time.

In step S304, the steps S301-S303 may be repeated a plurality of times (e.g. at least 10 times) for a plurality of different RRAM devices on the same chip or the same RRAM device, so as to obtain a plurality of measured data retention time.

For the same RRAM device which has been tested, it may be measured again after the erasing operation of the step S302.

In step S305, the high-resistance state failure probability F(t) of the RRAM device may be calculated according to F(t)=number of samples which have data retention time <t/total number of failed samples (as shown in FIG. 8).

In step S306, the high-resistance state failure probability F(t) of the RRAM device may be fitted according to Formula (2) to obtain the parameters p and t0/n. Then, the parameters may be substituted into Formula (3) to calculate the predicted data retention time $t_E$ at 120° C. and at the bias voltage (e.g. 0.1V).

In step S307, the steps S301-306 may be repeated several times, wherein the bias voltage applied to the RRAM device may be changed in the step S301 to obtain the predicted data retention time $t_E$ at different bias voltages (e.g. 0.1V, 0.2V, 0.3V, 0.4V) respectively.

In step S308, the predicted data retention time obtained at various bias voltages (e.g. 0.1V, 0.2V, 0.3V, 0.4V) may be fitted according to Formula (4) to extrapolate to the predicted data retention time $t_E$ at the zero bias voltage (as shown in FIG. 9).

As a result, the predicted data retention time $t_E^{-0,RT}$ in the high-resistance state failure at the room temperature and at the zero bias voltage may be obtained in the third embodiment.

If a programming operation is performed on the device in the step S302 to have a low-resistance state, followed by the same steps as mentioned above for the high-resistance state, the predicted data retention time in the low-resistance state failure may be obtained.

Fourth Embodiment

The method according to the fourth embodiment may perform measurements at the high temperature and under the stress test condition, in order to obtain the predicted data retention time of the RRAM device at the room temperature and at the zero bias voltage by extrapolation.

The failure of the RRAM device occurs earlier than the case at the room temperature and at the zero bias voltage, by combining the temperature acceleration measurement and the voltage acceleration measurement. Thus, the time for the measurement may be significantly reduced.

Figure 13:
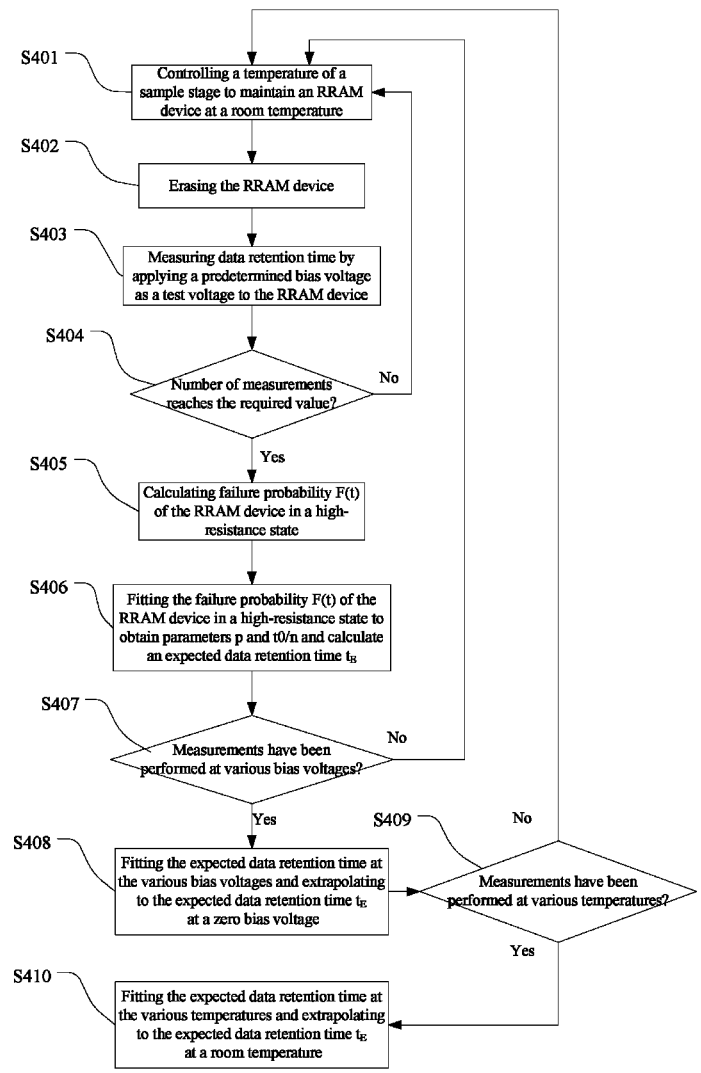
FIG. 13 shows a flowchart of a method for measuring data retention characteristic of an RRAM device according to a fourth embodiment of the present disclosure.

The method according to the fourth embodiment may comprise the following steps (see FIG. 13).

In step S401, the RRAM device may be maintained at the constant temperature (e.g. 120° C.) by controlling the temperature of the sample stage 11.

In step S402, an erasing operation may be performed on the RRAM device, so that the RRAM device is in the high-resistance state.

In step S403, the bias voltage (e.g. 0.1V) as shown in FIG. 4(b) may be applied to the RRAM device, in order to measure a variation of the resistance of the RRAM device under an approximate stress test condition with the time (as shown in FIG. 5), and to obtain the measured data retention time.

In step S404, the steps S401-S403 may be repeated a plurality of times (e.g. at least 10 times) for a plurality of different RRAM devices on the same chip or the same RRAM device, so as to obtain a plurality of measured data retention time.

For the same RRAM device which has been tested, it may be measured again after the erasing operation of the step S402.

In step S405, the high-resistance state failure probability F(t) of the RRAM device may be calculated according to F(t)=number of samples which have data retention time <t/total number of failed samples (as shown in FIG. 8).

In step S406, the high-resistance state failure probability F(t) of the RRAM device may be fitted according to Formula (2) to obtain the parameters p and t0/n. Then, the parameters may be substituted into Formula (3) to calculate the predicted data retention time $t_E$ at 120° C. and at the bias voltage (e.g. 0.1V).

In step S407, the steps S401-406 may be repeated several times, wherein the bias voltage applied to the RRAM device may be changed in the step S401 to obtain the predicted data retention time $t_E$ at different bias voltages (e.g. 0.2V, 0.3V, 0.4V) respectively.

In step S408, the predicted data retention time obtained at various bias voltages (e.g. 0.1V, 0.2V, 0.3V, 0.4V) may be fitted according to Formula (4) to extrapolate to the predicted data retention time $t_E$ at the zero bias voltage (as shown in FIG. 9).

In step S409, the steps S401-408 may be repeated several times, wherein the temperature of the sample stage 11 may be changed in the step S401 to obtain the predicted data retention time $t_E$ at different temperatures (e.g. 150° C., 180° C.) respectively.

In step S410, the predicted data retention time obtained at various temperatures (e.g. 120, 150° C., 180° C.) may be fitted according to Formula (3) to extrapolate to the predicted data retention time $t_E$ at the room temperature (as shown in FIG. 7).

As a result, the predicted data retention time $t_E^{0,RT}$ in the high-resistance state failure at the room temperature and at the zero bias voltage may be obtained in the fourth embodiment.

If a programming operation is performed on the device in the step S402 to have a low-resistance state, followed by the same steps as mentioned above for the high-resistance state, the predicted data retention time in the low-resistance state failure may be obtained.

The present disclosure has been described above with reference to the embodiments thereof. It should be understood that various modifications, alternations and additions can be made by those who skilled in the art without departing from the spirits and scope of the present disclosure. For example, as a variation of the fourth embodiment, the predicted data retention time at the room temperature at various bias voltages may be firstly extrapolated, and then the predicted data retention time at the zero bias voltage and the room temperature may be further extrapolated. Such a variation is obvious.

Therefore, the scope of the present disclosure is not limited to the above particular forms and details.

I/We claim:

1. A method for measuring data retention characteristic of an RRAM device, comprising the steps of:
   a) controlling a temperature of a sample stage to maintain the RRAM device at a predetermined temperature;
   b) setting the RRAM device to be a high-resistance state or a low-resistance state;
   c) measuring data retention time by applying a predetermined voltage to the RRAM device so that a resistive state failure of the RRAM device occurs;
   d) repeating the steps a)-c) a predetermined plurality of times no less than 10 times to perform a plurality of measurements;
   e) calculating a resistive state failure probability F(t) of the RRAM device from the data retention time in the plurality of measurements; and
   f) fitting the resistive state failure probability F(t), and calculating predicted data retention time $t_E$ by using parameters obtained from the fitting.

2. The method according to claim 1, wherein after the step (f), the method further comprises steps of:
   g) repeating the steps a)-f) to measure predicted data retention time at different bias voltages; and
   h) extrapolating predicted data retention time at a zero bias voltage from the predicted data retention time at the different bias voltages.

3. The method according to claim 2, wherein the following formula is used for extrapolating to the predicted data retention time at the zero bias voltage:

$$t_E^V = t_E \exp\left(-\frac{qaV}{2dkT}\right)$$

wherein a is a crystal lattice constant, d is an effective thickness, q is an oxygen ion charge, k is a Boltzmann constant, and T is an absolute temperature.

4. The method according to claim 2, wherein the predicted data retention time of the RRAM device is obtained at least at 3 different bias voltages.

5. The method according to claim 2, wherein after the step (h), the method further comprises steps of:
   i) repeating the steps a)-h) to measure predicted data retention time at different temperatures; and
   j) extrapolating predicted data retention time $t_E$ at a room temperature from the predicted data retention time at the different temperatures.

6. The method according to claim 5, wherein the following formula is used for extrapolating to the predicted data retention time at the room temperature:

$$t_E^T = \frac{t_0}{n|\ln(1-p)|} \approx \frac{t_0}{np} = \frac{t_0}{n}\exp\left(\frac{E_a}{kT}\right)(p \ll 1),$$

wherein n is a number of lattice points where spontaneous generation of oxygen vacancies occurs for the resistive failure in a high-resistance state, or a number of lattice points where spontaneous recombination of oxygen vacancies occurs for the resistive failure in a low-resistance state; $t_0$ is a vibration period of oxygen atoms; p is a generation probability of the oxygen vacancies in the high-resistance state or a recombination probability of the oxygen vacancies in the low-resistance state; $E_a$ is activation energy of generation or recombination of the oxygen vacancies; k is a Boltzmann constant, and T is an absolute temperature.

7. The method according to claim 5, wherein the predicted data retention time of the RRAM device is obtained at least at 3 different temperatures.

8. The method according to claim 1, wherein after the step (h), the method further comprises steps of:
   g') repeating the steps a)-f) to measure predicted data retention time at different temperatures; and
   h') extrapolating predicted data retention time at a room temperature from the predicted data retention time at the different temperatures.

9. The method according to claim 8, wherein after the step (h), the method further comprises steps of:
   i') repeating the steps a)-h') to measure predicted data retention time at different bias voltages; and
   j') extrapolating predicted data retention time $t_E$ at a room temperature from the predicted data retention time at the different bias voltages.

10. The method according to claim 9, wherein the following formula is used for extrapolating to the predicted data retention time at the zero bias voltage:

$$t_E^V = t_E \exp\left(-\frac{qaV}{2dkT}\right)$$

wherein a is a crystal lattice constant, d is an effective thickness, q is an oxygen ion charge, k is a Boltzmann constant, and T is an absolute temperature.

11. The method according to claim 9, wherein the predicted data retention time of the RRAM device is obtained at least at 3 different bias voltages.

12. The method according to claim 8, wherein the following formula is used for extrapolating to the predicted data retention time at the room temperature:

$$t_E^T = \frac{t_0}{n|\ln(1-p)|} \approx \frac{t_0}{np} = \frac{t_0}{n}\exp\left(\frac{E_a}{kT}\right)(p \ll 1),$$

wherein n is a number of lattice points where spontaneous generation of oxygen vacancies occurs for the resistive failure in a high-resistance state, or a number of lattice points where spontaneous recombination of oxygen vacancies occurs for the resistive failure in a low-resistance state; $t_0$ is a vibration period of oxygen atoms; p is a generation probability of the oxygen vacancies in the high-resistance state or a recombination probability of the oxygen vacancies in the low-resistance state; $E_a$ is activation energy of generation or recombination of the oxygen vacancies; k is a Boltzmann constant, and T is an absolute temperature.

13. The method according to claim 8, wherein the predicted data retention time of the RRAM device is obtained at least at 3 different temperatures.

14. The method according to claim 1, wherein the step b) comprises erasing the RRAM device to set the RRAM device in the high-resistance state, and in the step c), the resistive state failure occurs in the high-resistance state.

15. The method according to claim 1, wherein the step b) comprises programming the RRAM device to set the RRAM device in the low-resistance state, and in the step c), the resistive state failure occurs in the low-resistance state.

16. The method according to claim 1, wherein in the step f), the following formula is used:

$$F(t) = 1 - (1-p)^{\frac{nt}{t_0}},$$

wherein t is measured data retention time; n is a number of lattice points where spontaneous generation of oxygen vacancies occurs for the resistive failure in a high-resistance state, or a number of lattice points where spontaneous recombination of oxygen vacancies occurs for the resistive failure in a low-resistance state; to is a vibration period of oxygen atoms; and p is a generation probability of the oxygen vacancies in the high-resistance state or a recombination probability of the oxygen vacancies in the low-resistance state; and in the step f), the following formula is used for calculating the predicted data retention time:

$$t_E^T = \frac{t_0}{n|\ln(1-p)|} \approx \frac{t_0}{np} = \frac{t_0}{n}\exp\left(\frac{E_a}{kT}\right)(p \ll 1),$$

wherein $E_a$ is activation energy of generation or recombination of the oxygen vacancies, k is a Boltzmann constant, and T is an absolute temperature.

17. The method according to claim 1, wherein in the step c), immediately after a positive voltage is applied to the RRAM device for a time period, a negative voltage of the same absolute value is applied for the same time period, so as to avoid breakdown of the device due to a charge accumulation effect.

* * * * *